United States Patent
Blanchard et al.

(10) Patent No.: US 10,412,833 B2
(45) Date of Patent: Sep. 10, 2019

(54) METHOD TO NEUTRALIZE INCORRECTLY ORIENTED PRINTED DIODES

(71) Applicant: Nthdegree Technologies Worldwide Inc., Tempe, AZ (US)

(72) Inventors: Richard Austin Blanchard, Los Altos, CA (US); William Johnstone Ray, Fountain Hills, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 16/135,982

(22) Filed: Sep. 19, 2018

(65) Prior Publication Data

US 2019/0098759 A1    Mar. 28, 2019

Related U.S. Application Data

(60) Provisional application No. 62/564,050, filed on Sep. 27, 2017.

(51) Int. Cl.
*H01L 21/00* (2006.01)
*H05K 1/16* (2006.01)
(Continued)

(52) U.S. Cl.
CPC ......... *H05K 1/16* (2013.01); *H01L 21/02288* (2013.01); *H01L 21/561* (2013.01);
(Continued)

(58) Field of Classification Search
CPC .......... H05K 1/16; H01L 22/22; H01L 21/561
See application file for complete search history.

(56) References Cited

U.S. PATENT DOCUMENTS 9,913,371 B2 *  3/2018  Ray ............. H05K 1/0296
2006/0274799 A1 * 12/2006  Collins ............ H01S 5/06825
                                                        372/38.09
(Continued)

FOREIGN PATENT DOCUMENTS

EP       2160730 B1   6/2013
WO   WO-2019067371 A1 *  4/2019  ............. H01L 22/22

OTHER PUBLICATIONS

PCT/US2018/052486, EPO as ISA, International Search Report and Written Opinion, dated Feb. 21, 2019, 12 pages.

*Primary Examiner* — Laura M Menz
(74) *Attorney, Agent, or Firm* — Patent Law Group LLP; Brian D. Ogonowsky

(57) ABSTRACT

A programmable circuit includes an array of printed groups of microscopic transistors or diodes having pn junctions. The devices are pre-formed and printed as an ink and cured. The devices have a proper orientation and a reverse orientation after settling on a conductor layer. The devices are connected in parallel within small groups. To neutralize the reverse-oriented devices, a sufficient voltage is applied across the parallel-connected diodes to forward bias only the devices having the reverse orientation. This causes a sufficient current to flow through each of the reverse-orientated devices to destroy an electrical interface between an electrode of the devices and the conductor layer to create an open circuit, such that those devices do not affect a rectifying function of the devices in the group having the proper orientation. An interconnection conductor pattern may then interconnect the groups to form complex logic circuits.

20 Claims, 4 Drawing Sheets

(51) Int. Cl.
    *H01L 29/06*     (2006.01)
    *H05K 1/02*     (2006.01)
    *H01L 21/77*     (2017.01)
    *H05K 3/12*     (2006.01)
    *H01L 29/40*     (2006.01)
    *H01L 21/02*     (2006.01)
    *H05K 3/30*     (2006.01)
    *H01L 21/66*     (2006.01)
    *H01L 21/56*     (2006.01)
    *H01L 23/00*     (2006.01)
    *H03K 19/08*     (2006.01)
    *H03K 19/0175*     (2006.01)
    *H05K 1/18*     (2006.01)

(52) U.S. Cl.
    CPC .............. *H01L 21/77* (2013.01); *H01L 22/22* (2013.01); *H01L 24/82* (2013.01); *H01L 24/83* (2013.01); *H01L 24/97* (2013.01); *H01L 29/0646* (2013.01); *H01L 29/401* (2013.01); *H05K 1/0293* (2013.01); *H05K 3/12* (2013.01); *H05K 3/30* (2013.01); H01L 24/24 (2013.01); H01L 2224/24101 (2013.01); H01L 2224/24137 (2013.01); H01L 2224/29294 (2013.01); H01L 2224/29339 (2013.01); H01L 2224/29499 (2013.01); H01L 2224/73267 (2013.01); H01L 2224/8284 (2013.01); H01L 2224/82101 (2013.01); H01L 2224/8384 (2013.01); H01L 2224/83192 (2013.01); H01L 2224/95101 (2013.01); H01L 2224/95102 (2013.01); H01L 2224/95146 (2013.01); H01L 2224/97 (2013.01); H03K 19/017581 (2013.01); H03K 19/08 (2013.01); H05K 1/189 (2013.01); H05K 2201/026 (2013.01); H05K 2201/10166 (2013.01); H05K 2201/10174 (2013.01); H05K 2203/0783 (2013.01); H05K 2203/1115 (2013.01); H05K 2203/175 (2013.01)

(56) References Cited

U.S. PATENT DOCUMENTS

| | | | |
|---|---|---|---|
| 2014/0268591 A1* | 9/2014 | Ray | H05K 1/0296 361/748 |
| 2016/0380447 A1* | 12/2016 | Kadirvel | H02J 7/0026 320/112 |
| 2018/0114775 A1* | 4/2018 | Ray | H01L 25/0655 |
| 2019/0098759 A1* | 3/2019 | Blanchard | H01L 21/561 |

* cited by examiner

METHOD TO NEUTRALIZE INCORRECTLY ORIENTED PRINTED DIODES

CROSS-REFERENCE TO RELATED APPLICATIONS

This application claims priority to U.S. provisional application Ser. No. 62/564,050, filed Sep. 27, 2017, assigned to the present assignee and incorporated herein by reference.

FIELD OF THE INVENTION

This invention relates to printing pre-formed, microscopic diodes or transistors in a solution to form circuits and, in particular, to a technique to neutralize diodes or transistors that have an incorrect orientation after the diode ink is printed and cured.

BACKGROUND

Applicant's U.S. Pat. No. 9,913,371, incorporated herein by reference, describes how to print circuit components, such as diodes, in an array of tiny dots. Each diode may have a width between 10-200 microns. The positions of the dots may be accurately determined by screen printing, flexography, or other printing technique. Each dot contains a few identical diodes, and the number of diodes in a single dot is random due to the diodes being infused in a liquid ink and printed. For example, there may be an average of five diodes in a single dot.

The diodes are shaped to generally orient themselves in the desired direction (e.g., anode facing up) on an array of conductive areas on a substrate surface as the diodes settle on the substrate surface prior to curing the ink. For example, the diodes may have a relatively tall, narrow anode contact on top and a wide heavy cathode contact on the bottom so that the diodes settle on the substrate surface with the cathode facing the conductive area on the substrate. After curing the ink, the cathode electrically contacts the associated conductive area.

After the diodes are printed and cured, a thin dielectric layer is deposited to cover the bottom conductive layer yet expose the "tall" top anode electrode. A top conductive layer is then deposited over each dot so a group of diodes is sandwiched between two conductive layers. The diodes in each separate dot are therefore connected in parallel and effectively form a single diode.

Groups of microscopic transistors may be formed in the same way.

More detail of printing microscopic semiconductor components and controlling their orientation on a substrate may be found in Applicant's U.S. Pat. No. 8,852,467, entitled, Method of Manufacturing a Printable Composition of Liquid or Gel Suspension of Diodes, assigned to the present assignee and incorporated herein by reference.

The tiny groups of diodes and/or transistors may be interconnected with a customized conductor pattern to form any type of logic circuit, including very complex circuits. However, if even one diode in a group of parallel-connected diodes has the wrong orientation, the group would not properly act as a rectifier. Therefore, it is important that all diodes electrically connected in parallel have the same orientation. A similar issue may apply to printed transistors, where all transistors electrically connected in parallel in a single group must have the same orientation for the group to act as a single transistor.

Even with the special fluid-dynamic shapes of the diodes and transistors, proper orientation is achieve about 90% of the time. Therefore, on average, one in ten diodes has the wrong orientation. So, the reliability of any complex circuit being formed of interconnected dots of printed diodes or transistors is very low.

Therefore, what is needed is a technique to ensure that all printed diodes electrically connected in parallel have the same orientation. The technique should also be applicable to ensuring that all printed transistors electrically connected in parallel have the same orientation.

SUMMARY

In the example of printing diodes in small groups and connecting the diodes in each individual group in parallel, it is important that each diode have the proper orientation so that each group acts as a single diode. Generally, there will be about 10% of the printed diodes in the array of small groups that have the wrong orientation. This may amount to hundreds of diodes, depending on the number of groups printed. The diodes in each group are sandwiched between two conductor layers, and each conductor layer is accessible via an electrical lead extending from the groups. The leads may extend to a patch area on the substrate for simplifying the customized interconnections of the groups in a separate interconnection step. A single substrate with an array of groups of components may be used to create a wide array of logic circuits by customizing the interconnections in the patch area.

Once the diodes are printed and cured, let's assume the top conductor layer for each group is the anode terminal and the bottom conductor layer is the cathode terminal. The anode electrode of the individual diodes may be a tall, narrow electrode, and the cathode electrode of the diodes may be a wide electrode on the opposite surface. The anode electrodes of the diodes face up in the proper orientation and face down in a reverse orientation.

A voltage is then applied across the two conductor layers that only forward biases the reverse-orientated diodes. Therefore, a current will flow through only the reverse-oriented diodes. As the voltage is increased, the current will increase, which increases the heat at the interface of the narrow anode electrodes and the bottom conductor layer (due to the high current density at the interface). This interface area will generally be the "weakest link." At a certain current level, the high heat will break down, such as melt or ablate, the bottom conductor layer at the interface to create a thin gap to cause each reverse-oriented diode to be an open circuit between the two conductor layers.

Therefore, by carefully controlling the current through the reverse-oriented diodes, only the contact areas of those diodes will become open circuits, and the remaining (proper orientated) diodes will be unaffected since they do not conduct any current. As a result, all the diodes whose electrodes are electrically connected between the two conductor layers will have the proper orientation, and all the diodes with the reverse orientation will be neutralized.

In another embodiment, a special fuse layer is used that has a very controlled current limit before the open circuit occurs. In one embodiment, the fuse layer conducts in only the Z direction and is formed between one of the conductor layers and the diodes.

Since the resulting circuits, after the groups of diodes are interconnected to form a customized circuit, are typically low current logic circuits, the currents used for normal operations are much less than the currents used to create the neutralized diodes.

A similar process may be used for neutralizing reverse-oriented printed transistors.

Other embodiments are disclosed.

BRIEF DESCRIPTION OF THE DRAWINGS

Elements that are similar or identical in the various figures are labeled with the same numeral.

DETAILED DESCRIPTION

The printed programmable circuits used in the examples may use any combination of passive devices (e.g., capacitors, resistors), 2-terminal inorganic semiconductor devices (e.g., diodes), and 3-terminal inorganic semiconductor devices (e.g., transistors). The diodes and transistors are printed as dots of identical devices, and the devices in each dot are connected in parallel so that each dot effectively forms a single device. The various devices may be formed in an array on a single substrate, and the devices are interconnected by metal traces to form a customized circuit. One step in the process neutralizes all reverse-oriented diodes and transistors and is the focus of the present invention.

Figure 1:
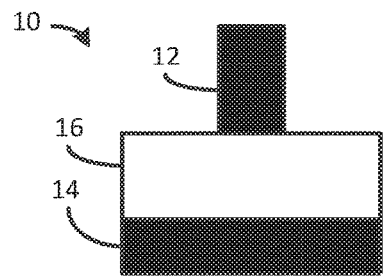
FIG. 1 is a side view of a printable diode.

FIG. 1 is a side view of a printable diode 10. The diode 10 may have a hexagonal base, a square base, or other shape. Many identical diodes 10 are infused in a solution, such as comprising alcohol, to form a printable diode ink. The diodes 10 are microscopic, such as having diameters between 10-200 microns. The diodes 10 are designed to orient themselves, after being printed on a substrate, with the tall/narrow anode electrode 12 facing upward and the wide/heavy cathode electrode 14 facing the substrate. The body 16 of the diode 10 has a silicon pn junction. The shapes of the electrodes 12/14 cause the proper orientation due to fluid dynamics. About 90% of the diodes 10 have the proper orientation after the ink is printed and cured.

Figure 2:
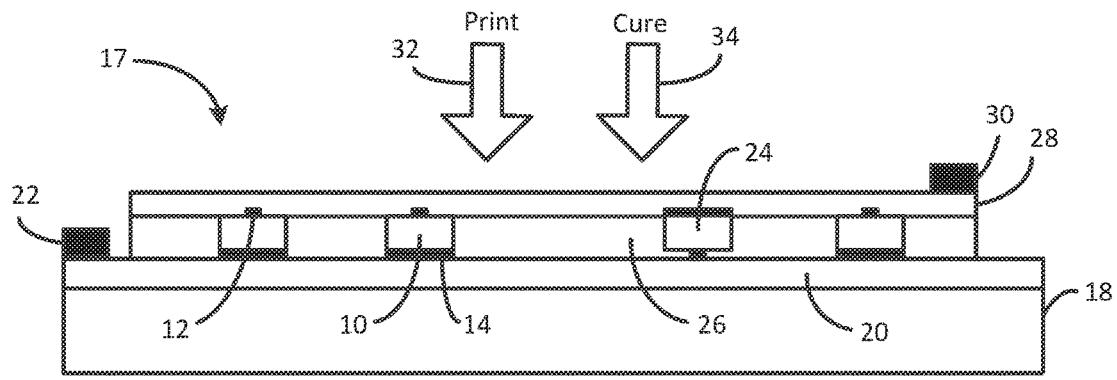
FIG. 2 is a simplified cross-sectional view of a group of printed diodes connected in parallel, where one of the diodes has an incorrect reverse orientation.

FIG. 2 is a cross-sectional view of a group of printed diodes 10 connected in parallel. The structure may be in the form of a printed dot 17. A substrate 18 is preferably thin and flexible for light weight, low cost, good heat conduction to air or a heat sink, and ease of processing. The substrate 18 may be a suitable polymer, such as polycarbonate, PMMA, or PET, and may be flexible so as to be dispensed from a roll. The substrate 18 can be any size suitable for the ultimate product. The substrate 18 may be a conventional flex-circuit substrate, where metal (e.g., copper) traces have been already formed on the substrate 18 by conventional means prior to the below processing steps.

If the substrate 18 does not already have metal traces formed on it as a flex-circuit, a conductor layer 20 (e.g., silver, aluminum, copper) is deposited on the substrate 18, such as by printing, to form an array of metal pads. In the various examples, the conductor layer 20 is printed as an array of circular pads on the substrate 18. A metal lead 22 may extend from each metal pad for later connection to metal leads for other devices. The metal lead 22 may be on the top surface of the substrate 18 or connected to metal leads on the bottom surface of the substrate 18 by conductive vias through the substrate 18. The metal pads are electrically isolated from one another to allow groups of the diodes 10 to be interconnected in any manner to form logic circuits.

The diodes 10 are printed on the conductor layer 20 such as by flexography or by screen printing with a suitable mesh to allow the diodes 10 to pass through and control the thickness of the layer. Because of the comparatively low concentration, the diodes 10 will be printed over the conductor layer 20 as a loose monolayer and be fairly uniformly distributed over each metal pad. The printed locations of the diodes 10 align with the locations of the printed areas of the conductor layer 20.

The solvent is then evaporated by heat using, for example, an infrared oven. After curing, the diodes 10 remain attached to the underlying conductor layer 20 with a small amount of residual resin that was dissolved in the ink as a viscosity modifier. The adhesive properties of the resin and the decrease in volume of resin underneath the diodes 10 during curing press the cathode electrode 14 against the underlying conductor layer 20, making ohmic contact with it. The anode and cathode designations of the electrodes of the diodes 10 may be reversed.

As shown in FIG. 2, one of the diodes 24 has a reverse orientation due to some inherent randomness in the printing process. Therefore, the diode 24 has to be neutralized prior to programming the circuit.

A thin dielectric layer 26 is then printed to cover the conductor layer 20 and further secure the diodes 10/24 in position. The dielectric layer 26 is designed to self-planarize during curing, by surface tension, so as to pull off of or de-wet the anode electrode 12. Therefore, etching the dielectric layer 26 is not required. If the dielectric layer 26 covers the electrodes 12, then a blanket etch may be used to expose the electrodes 12.

A top conductor layer 28, aligned with the metal pads of the bottom conductor layer 20, is then printed over the dielectric layer 26 to electrically contact the anode electrodes 12 and is cured in an oven appropriate for the type of conductor being used. The conductor layers 20 and 28 may be printed, thin nano-wire layers or other conductive layers. A nano-wire layer may comprise thin silver wires in a liquid that are sintered together by heat in a curing step.

Metal leads 30 are then formed as leads for interconnecting the top conductor layer 28 to other devices.

FIG. 2 also illustrates that the only steps needed to form the structure of FIG. 2 are printing and curing steps 32 and 34.

In some cases, diodes settle on their sides and naturally form open circuits.

Figure 3:
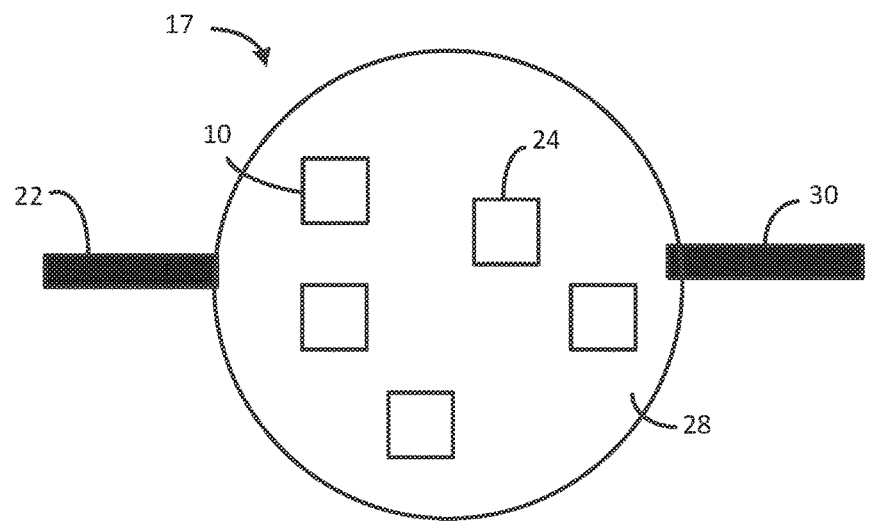
FIG. 3 is a top down view of a circular group of printed diodes on a substrate with anode and cathode metal traces extending from the group.

FIG. 3 is a top down view of the dot 17 of FIG. 2 showing five diodes 10, including the reverse-oriented diode 24. The diodes 10 are in random locations within the dot 17 as a natural result of printing diode ink. Metal leads 22 and 30 extend from the bottom conductor layer 20 (FIG. 2) and the top conductor layer 28. The dot 17 may be one of a large number of similar dots in an ordered array.

Figure 4:
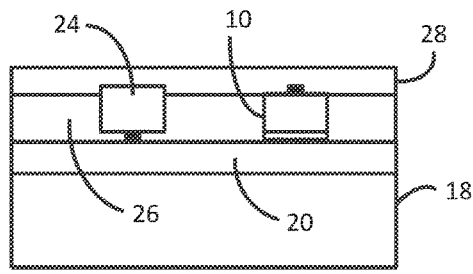
FIG. 4 illustrates only two of the printed diodes in FIG. 2, where one of the diodes has a reverse orientation.
Figure 5:
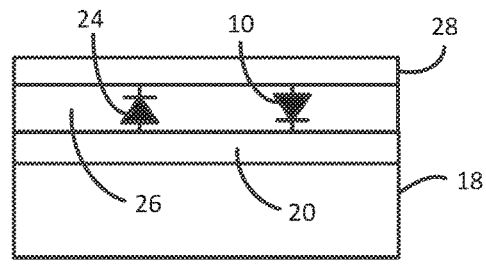
FIG. 5 is an equivalent schematic of the structure of FIG. 4.

FIG. 4 illustrates a proper-oriented diode 10 and a reverse-oriented diode 24 in the dot 17 of FIG. 3, and FIG. 5 illustrates the equivalent structure using schematic symbols.

The reverse-oriented diode 24 must be neutralized in order for the rectifying function of the dot 17 to work.

Figure 6:
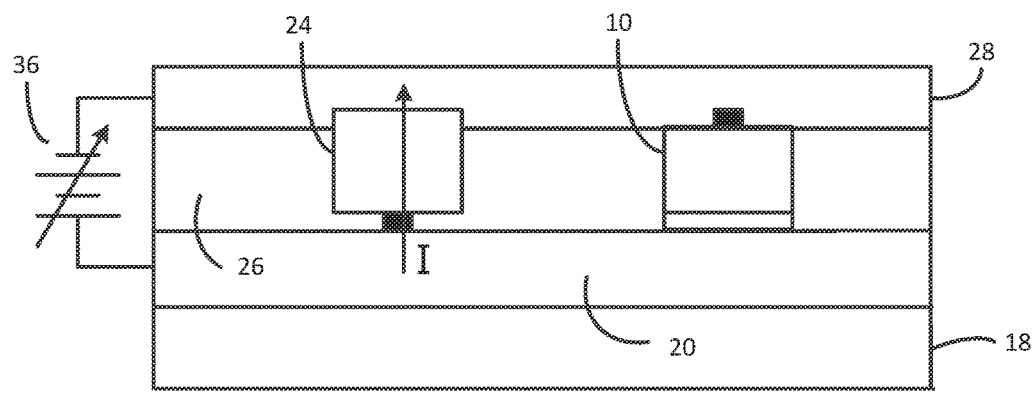
FIG. 6 illustrates a controllable voltage being applied across the diodes of FIG. 4 and any other diodes printed on the substrate. The voltage forward biases only the reverse-oriented diodes and causes a high current to flow through these reverse-oriented diodes.

FIG. 6 illustrates a controllable voltage source 36, which may also be a controllable current source, coupled across the bottom conductor layer 20 and the top conductor layer 28. The voltage source 36 forward biases the reverse-oriented diode 24 so that a current I flows through all the reverse-oriented diodes 24. This may be done by forming a temporary first metal trace connected to all bottom conductor areas and a temporary second metal trace connected to all the top conductor areas. Probe pins of the voltage source 36 then contact the metal pads for the two metal traces to supply the current through all the reverse-oriented diodes 24 simultaneously to generate localized heating. The forward voltage begins at around 0.7 volts and is increased until the currents through all the reverse-oriented diodes 24 cause sufficient heat to damage the conductor area around either the anode or cathode electrode of the reverse-oriented diodes 24.

Figure 7:
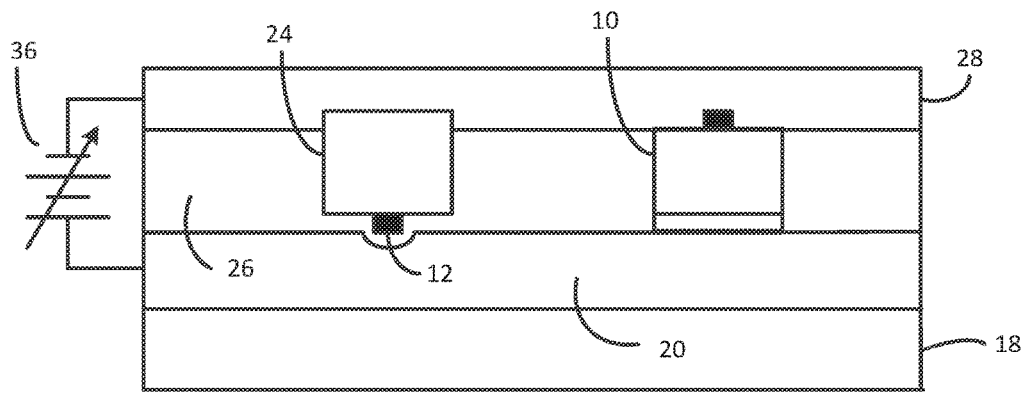
FIG. 7 illustrates an open circuit at the interface of the anode of the reverse-oriented diode and the bottom conductor layer due to the high heat generated by the high current density at the interface. The reverse-oriented diode is thus neutralized.

FIG. 7 illustrates that the high heat has melted or ablated the bottom conductor layer 20 under the anode electrode 12 of the diode 24, assuming the highest current density is where the small electrode 12 contacts the conductor layer 20. A small void or crater is created in the conductor layer 20. This creates an open circuit that neutralizes the diode 24. The reverse-oriented diodes in the various dots will become open circuits at slightly different times, and the voltage may be slowly increased until an open circuit is detected across the probes. The neutralizing process may take a few seconds in a roll-to-roll process used to form the programmable circuit.

Figure 8:
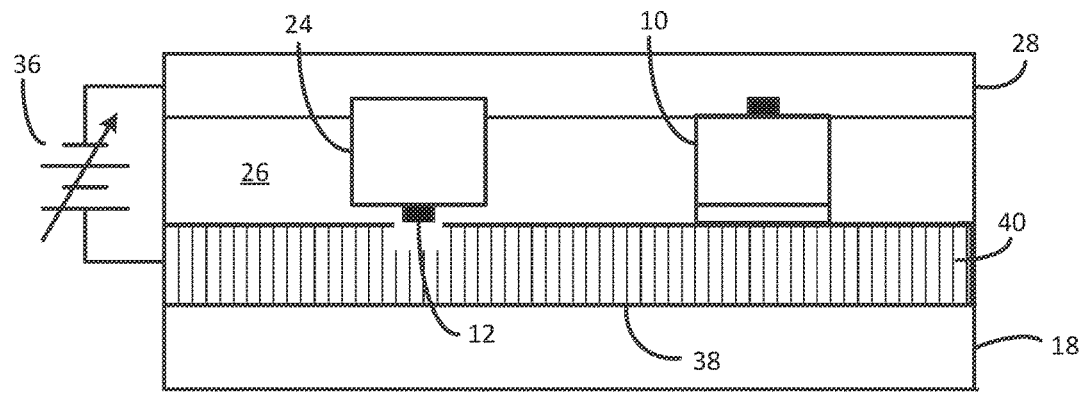
FIG. 8 illustrates a nano-wire type bottom conductor layer, where the nano-wires act as fuses which blow due to the high current density, causing an open circuit in the vicinity of the reverse-oriented diode. The reverse-oriented diode is thus neutralized. Such a fuse layer may instead be formed between one of the conductor layers and the diodes, where the fuse layer only conducts in the Z direction.

FIG. 8 illustrates the use of a sintered nano-wire bottom conductor layer 38. Small silver wires 40 are infused in a liquid to allow the conductor layer 38 to be printed. Upon curing with heat, the silver wires are sintered together to form a conductive mesh. In the area of the anode electrode 12, the heat from the high current melts the silver wires, like fuses, and results in an open circuit. The layer 38 acts as a fuse layer with the nano-wires acting like small fuses.

In other embodiments, the thin and tall diode electrode is the cathode electrode.

After the neutralizing step, the temporary metal traces (busses) that connected the top conductor areas together for the dots 17 and connected the bottom conductor areas together are severed, such as with a laser, to cause each dot 17 to be electrically isolated.

Figure 9:
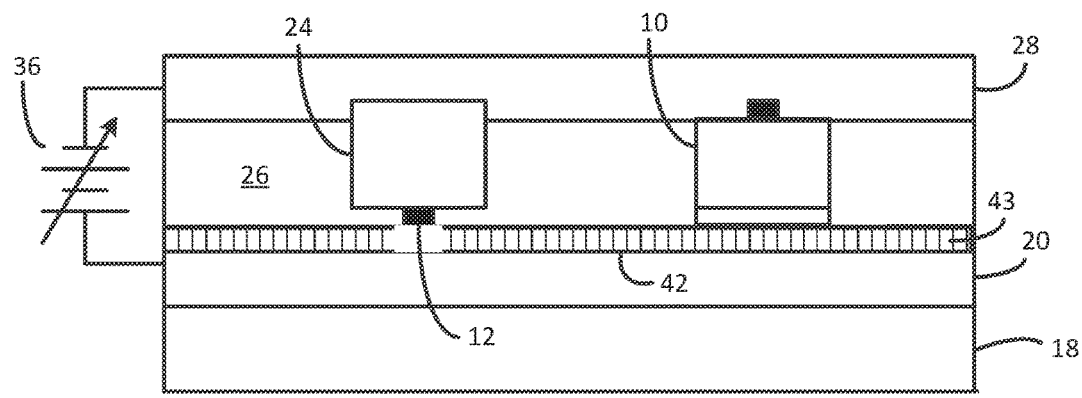
FIG. 9 illustrates the use of an additional, thin fuse layer between the diodes and one of the conductor layers.

In another embodiment, as shown in FIG. 9, a separate fuse layer 42 may be deposited between the bottom conductor layer 20 and the diodes 10, where the fuse layer 42 is a very good vertical conductor but a poor lateral conductor. The bottom conductor layer 20 carries the lateral current. The fuse layer 42 is designed to create a vertical open circuit, at a certain current level, where the diode's anode electrode 12 contacts the fuse layer 42. This enables the neutralization to occur at a more predictable current level. The fuse layer 42 may be an array of thin vertical nano-wires 43 (e.g., diameters about 15 nm) that only conduct in the vertical direction (the Z direction). Such Z-conduction materials are known but are not intended to be used as fuse layers.

In another embodiment, between the bottom conductor layer 20 and the diodes 10 is formed a thin fuse layer comprising sintered particles of a low-melting temperature metal such as bismuth (Bi). This may also be represented by the fuse layer 42 in FIG. 9. Such a layer will form an open circuit (a tiny crater or void) for a reverse-oriented diode at a relatively low current. The thin fuse layer can also be formed between the top conductor layer 28 and the diodes 10.

Figure 10:
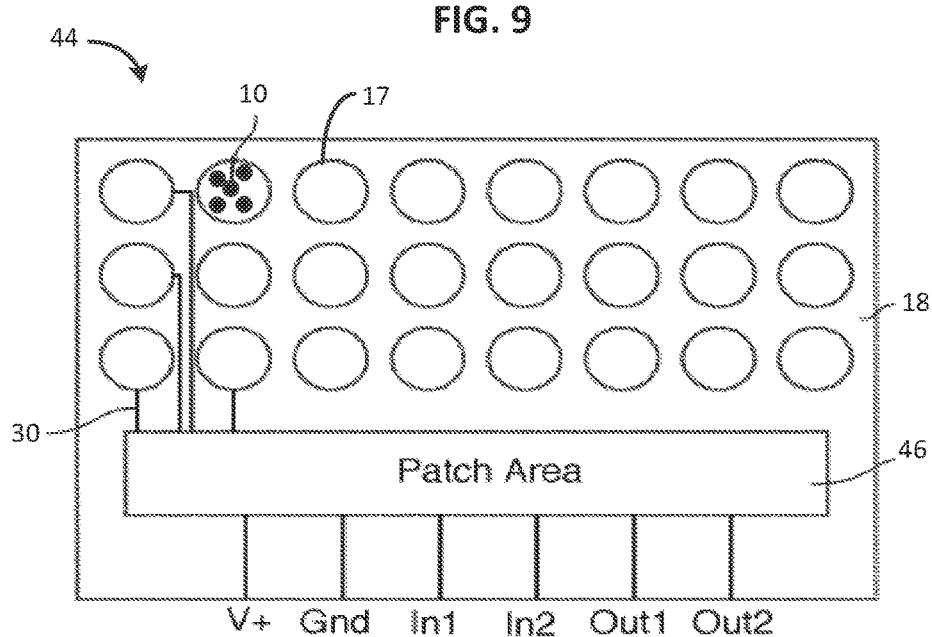
FIG. 10 is a simplified top down view of a programmable circuit comprising groups (printed dots) of parallel-connected semiconductor components, such as diodes and transistors, where the components in the various groups are interconnected at a patch area to for a complex circuit, such as a logic circuit. The circuit has undergone the step of neutralizing all the reverse-oriented diodes and transistors.

FIG. 10 illustrates a small portion of a programmable circuit 44, showing an array of dots 17 containing a number of diodes 10, where the diodes 10 within each dot 17 are connected in parallel by the top and bottom conductor layers. Metal leads 30 lead from the top conductor layer for each dot 17, and other metal leads are formed on the bottom surface of the substrate 18 that connect to the bottom conductor layer for each dot 17. All the leads terminate in a patch area 46. In a programming step, an interconnection pattern is formed within the patch area 46 to interconnect any combination of the leads to form a customized circuit, such as a complex logic circuit. The interconnection pattern may be formed using a mask for printing a metal ink. The mask may form a hydrophobic pattern, and the metal ink only resides in the areas of the patch area 46 exposed by the hydrophobic pattern.

The temporary metal bus traces that connect across all the leads for the neutralizing step may be within the patch area 46.

Input/output terminals for the programmable circuit 44 are also shown, which include a positive voltage terminal V+, a ground terminal Gnd, a first input terminal In1, a second input terminal In2, a first output terminal Out1, and a second output terminal Out2. Many more input and output terminals may be provided depending on the size and complexity of the circuit 44. Complex circuits, such as state machines, counters, etc. may be formed using a customized interconnection in the patch area 46.

The same neutralization process may be used for creating open circuits with reverse-oriented printed transistors, where a pn junction in the reverse-oriented transistors is forward biased to cause a sufficient current to flow to destroy a localized area of the conductor layer to form the open circuit.

Figure 11:
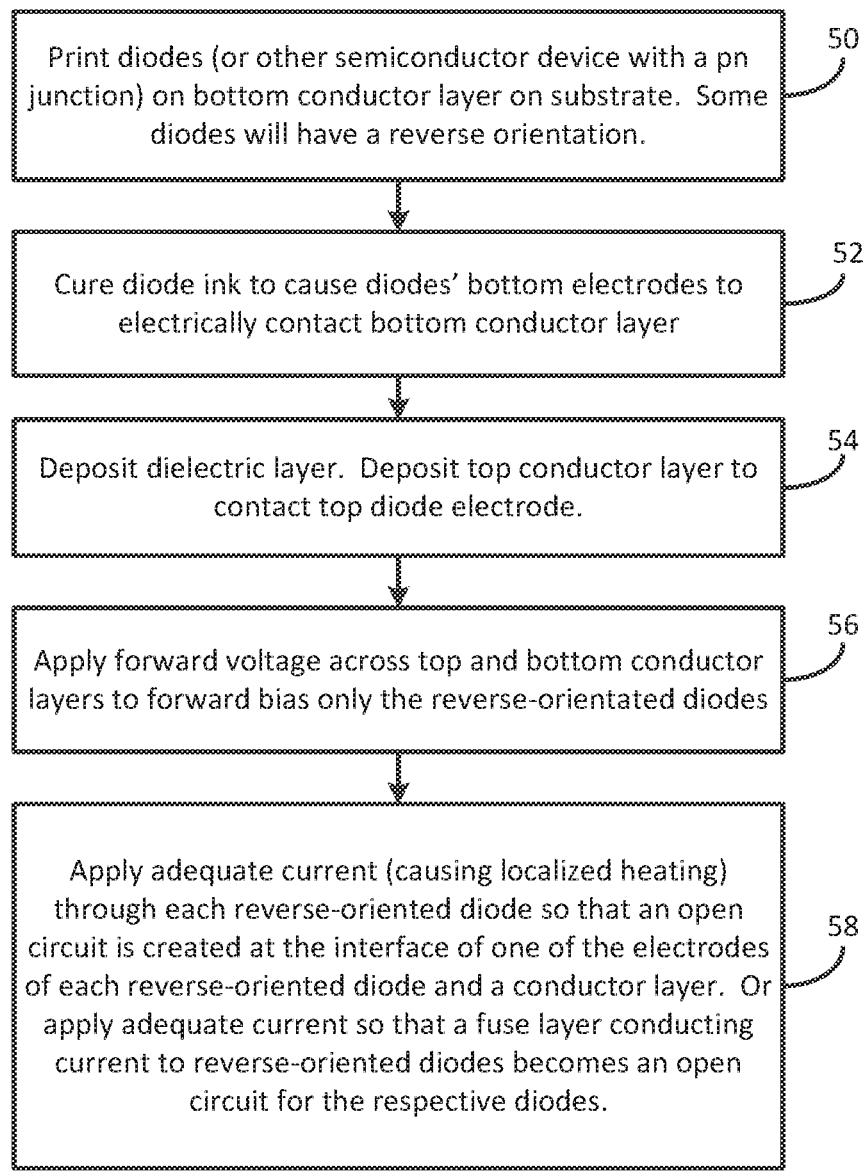
FIG. 11 is a flowchart of steps used in one embodiment to neutralize printed reverse-oriented diodes or transistors.

FIG. 11 is a flowchart illustrating certain steps in one embodiment of the invention for neutralizing reverse-oriented diode junctions, which may be in printed diodes or printed transistors.

In step 50, diodes are printed on a bottom conductor layer, where some of the diodes have a reverse-orientation.

In step 52, the diode ink is cured to cause the diodes' bottom electrodes to electrically contact the bottom conductor layer.

In step 54, the diodes are sandwiched between two conductor layers with a dielectric layer in-between.

In step 56, a forward voltage is applied to the reverse-oriented diodes to generate current and localized heat.

In step 58, the forward voltage is increased to achieve the necessary current to destroy the portion of a conductor layer or fuse layer abutting the anode electrode (assuming the anode electrode is the thin and tall electrode) to create open circuits, neutralizing all the reverse-orientated diodes. To limit current, the voltage may be sequentially applied to subsets of the diodes.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a circuit comprising:
   printing pre-formed devices having a pn junction on a first conductor, the devices having a first electrode and a second electrode, wherein the devices are printed as an ink and have a proper orientation and a reverse orientation after settling on the first conductor;
   curing the ink such that one of the first electrode and second electrode, depending on the devices' orientations, electrically contacts the first conductor;
   depositing a second conductor over the devices such that the other of the first electrode and second electrode electrically contacts the second conductor, wherein groups of the devices are electrically connected in parallel by the first conductor and second conductor; and
   applying a sufficient voltage across the first conductor and second conductor to forward bias the devices having the reverse orientation, causing a sufficient current to flow through each of the devices having the reverse orientation to create an open circuit, such that the devices having the reverse orientation do not affect a rectifying function of the devices having the proper orientation.

2. The method of claim 1 wherein the step of printing the pre-formed devices comprises printing the pre-formed devices in groups such that all devices having the proper orientation are electrically connected in parallel within each group.

3. The method of claim 1 wherein the step of applying the sufficient voltage comprises coupling a controllable current source to the first conductor and the second conductor.

4. The method of claim 1 wherein the step of applying the sufficient voltage comprises coupling a controllable voltage source to the first conductor and the second conductor.

5. The method of claim 1 wherein the first electrode of the devices is formed on a first surface of the device and comprises an electrode extending from the first surface that is narrower than a body of the device, and wherein the second electrode is formed on a second surface of the device that covers the second surface, wherein the proper orientation of the device is when the second electrode faces the first conductor.

6. The method of claim 1 wherein applying the sufficient voltage comprises raising a current through the reverse oriented devices until heat at an interface of one of the first electrode and the second electrode and one of the first conductor and second conductor causes the open circuit.

7. The method of claim 1 further comprising depositing a fuse layer, wherein a portion of the fuse layer melts during the step of applying the sufficient voltage to cause the open circuit.

8. The method of claim 1 wherein the circuit comprises a programmable circuit, wherein the step of printing the pre-formed devices comprises printing the pre-formed devices in groups such that all devices having the proper orientation are electrically connected in parallel within each group, the method further comprising:
   interconnecting the groups of devices to form a logic circuit.

9. The method of claim 8 further comprising:
   forming one or more input terminals for receiving input signals;
   forming one or more output terminals for outputting output signals; and
   interconnecting the pre-formed devices to perform an electrical function on the input signals to generated the output signals.

10. The method of claim 1 wherein the step of printing the pre-formed devices comprises printing the pre-formed devices in groups such that all devices having the proper orientation are electrically connected in parallel within each group, and wherein each group is formed as a dot containing a plurality of the devices.

11. The method of claim 1 wherein the devices comprise diodes.

12. The method of claim 1 wherein the devices comprise transistors.

13. The method of claim 1 wherein the first conductor and the second conductor are connected to leads, and the step of applying the sufficient voltage comprises applying the sufficient voltage to the leads.

14. A circuit comprising:
   a substrate;
   a plurality of separate groups of pre-formed, semiconductor electrical devices that have been mixed in a first solution, deposited over the substrate, and cured;
   the devices containing a pn junction;
   each group containing a plurality of substantially identical electrical devices sandwiched between a first conductor and a second conductor, the electrical devices being randomly distributed within each group on the substrate;
   some of the groups containing devices having a proper orientation and a reverse orientation; and
   wherein the reverse-oriented devices form an open circuit such that only the devices with the proper orientation within each group are electrically connected in parallel by the first conductor and the second conductor.

15. The circuit of claim 14 further comprising a fuse layer that forms an open circuit only for the devices having the reverse orientation.

16. The circuit of claim 14 wherein the open circuit comprises an interface between an electrode of the reverse-oriented devices and one of the first conductor and second conductor having been melted away by heat generated by a current through the reverse-oriented devices.

17. The circuit of claim 14 wherein a first electrode of the devices extends from a first surface that is narrower than a body of the device, and wherein a second electrode is formed on a second surface of the device that covers the second surface, wherein the proper orientation of the device is when the second electrode faces the first conductor.

18. The circuit of claim 14 wherein the circuit comprises a programmable circuit, wherein the groups of devices are interconnectable to form a digital circuit.

19. The circuit of claim 18 further comprising:
one or more input terminals for receiving input signals;
one or more output terminals for outputting output signals; and
the groups of devices being interconnected to be part of a digital circuit that performs an electrical function on the input signals to generated the output signals.

20. The circuit of claim 14 wherein the devices comprise diodes.

* * * * *